(12) United States Patent
Herrell et al.

(10) Patent No.: US 6,828,666 B1
(45) Date of Patent: *Dec. 7, 2004

(54) LOW INDUCTANCE POWER DISTRIBUTION SYSTEM FOR AN INTEGRATED CIRCUIT CHIP

(75) Inventors: Dennis J. Herrell, Austin, TX (US); Thomas P. Dolbear, Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 710 days.

(21) Appl. No.: 09/099,758

(22) Filed: Jun. 18, 1998

Related U.S. Application Data

(60) Provisional application No. 60/078,943, filed on Mar. 21, 1998, and provisional application No. 60/078,944, filed on Mar. 21, 1998.

(51) Int. Cl.$^7$ .............................................. H01L 23/52
(52) U.S. Cl. ..................................... 257/691; 257/697
(58) Field of Search ................................ 257/691, 697, 257/698, 686, 723

(56) References Cited

U.S. PATENT DOCUMENTS

| | | |
|---|---|---|
| 3,880,493 A | 4/1975 | Lockhart, Jr. ............. 339/147 R |
| 4,322,778 A | 3/1982 | Barbour et al. .............. 361/414 |
| 4,636,918 A | 1/1987 | Jodoin ........................ 361/405 |

(List continued on next page.)

OTHER PUBLICATIONS

*Proceedings of the Technical Program*, NEPCON East '93 Conference, Boston, MA, Jun. 14–17, 1993.

(List continued on next page.)

*Primary Examiner*—Phat X. Cao
(74) *Attorney, Agent, or Firm*—Zagorin, O'Brien & Graham LLP

(57) ABSTRACT

A low impedance electrical pathway from decoupling capacitance located on a circuit board to an integrated circuit chip. The integrated circuit includes multiple power and ground C4 bumps and is positioned on a first side of an integrated circuit carrier which is positioned on a first side of a circuit board. The integrated circuit carrier includes lateral conductors such as voltage and ground power planes. Power and ground carrier vias extend from the voltage and ground power planes, respectively, to the first side of the carrier, and power and ground subgroups of carrier vias extend from the voltage and ground power planes, respectively, to power and ground solder balls on a second side of the carrier. The circuit board includes power and ground plated through holes extending from contact pads on the first side of the circuit board to contact pads on a second side of the circuit board. Decoupling capacitors are positioned on the second side of the circuit board. The decoupling capacitors have positive and negative electrodes are electrically coupled to the power and ground plated through holes respectively. The C4 power and ground bumps, the power and ground carrier vias, the power and ground carrier via subgroups, the power and ground solder balls, the contact pads, the power and ground plated through holes, and the positive and negative electrodes are arranged in anti-parallel tessellations to reduce the inductance of a loop circuit from the decoupling capacitors to the integrated chip circuit.

19 Claims, 8 Drawing Sheets

U.S. PATENT DOCUMENTS

| | | | | |
|---|---|---|---|---|
| 4,754,366 A | | 6/1988 | Hernandez | 361/306 |
| 4,906,866 A | | 3/1990 | Alexander et al. | 307/443 |
| 4,954,877 A | * | 9/1990 | Nakanishi et al. | 357/80 |
| 4,982,311 A | | 1/1991 | Dehaine et al. | 361/388 |
| 4,994,936 A | | 2/1991 | Hernandez | 361/306 |
| 5,034,850 A | | 7/1991 | Hernandez et al. | 361/306 |
| 5,258,575 A | | 11/1993 | Beppu et al. | 174/52.4 |
| 5,377,079 A | | 12/1994 | Morita et al. | 361/752 |
| 5,475,264 A | * | 12/1995 | Sudo et al. | 257/723 |
| 5,475,565 A | | 12/1995 | Bhattacharyya et al. | 361/719 |
| 5,557,502 A | | 9/1996 | Banerjee et al. | 361/712 |
| 5,625,221 A | | 4/1997 | Kim et al. | 257/686 |
| 5,672,911 A | * | 9/1997 | Patil et al. | 257/691 |
| 5,789,807 A | * | 8/1998 | Correale, Jr. | 257/691 |
| 5,847,936 A | * | 12/1998 | Forehand et al. | 257/773 |
| 5,898,217 A | * | 4/1999 | Johnston | 257/691 |

OTHER PUBLICATIONS

Lau, John H., *Ball Grid Array Technology*, 1995, pp. 30, 48, 146–152, 208–219, 280–282, 369–376.

*Proceedings of the 1993 International Electronics Packaging Conference*, San Diego, CA, Sep. 12–15, 1993.

Johnson, Randy et al., "A Feasibility Study of Ball Grid Array Packaging", NEPCON Conference, Jun. 14–17, 1993, pp. 413–422.

Lau, John H., "Ball Grid Array Technology", McGraw–Hill, Inc., New York, 1995, pp. 30, 48, 146–152, 208–219, 280–282, and 369–376.

Yip, Wai–Yeung and Tsai, Chi–Taou, "Electrical Performance of an Overmolded Pad Array Carrier (OMPAC)", Proceedings of the 1993 International Electronics Packaging Conference, vol. Two, Sep. 12–15, 1993, pp. 731–739.

Herrell, Dennis and Becker, Ben, "Power system design for high performance PC microprocessors", IEEE International Workshop on Chip–Package Codesign CPD '98, ETH Zürich, Switzerland, Mar. 24–26, 1998, pp. 46–47.

* cited by examiner

LOW INDUCTANCE POWER DISTRIBUTION SYSTEM FOR AN INTEGRATED CIRCUIT CHIP

This application claims benefit of U.S. Provisional Application No. 60/078,943, filed Mar. 21, 1998 and the benefit of U.S. Provisional Application No. 60/078,944, filed Mar. 21, 1998.

BACKGROUND OF THE INVENTION

1. Field of the Invention

This invention relates to power distribution, and more particularly, to a low impedance power distribution system for an integrated circuit chip.

2. Description of the Related Art

The electrical coupling of an integrated circuit such as a microprocessor to a power supply can be modeled as a resistance-inductance-capacitance (RLC) circuit. A series of conductive paths define a power supply loop circuit from a first terminal of the power supply to the integrated circuit and back from the integrated circuit to a second terminal of the power supply. The electrical characteristics of these conductors (e.g., resistance, capacitance and inductance) and their configuration define the AC impedance of the loop circuit.

A well designed power distribution system should provide a well-regulated supply voltage over a wide range of frequencies from a peak frequency, down through mid-frequencies, to very low frequencies characterized by sleep modes. Unfortunately, even well designed power distribution systems will exhibit an imperfect, i.e., non-uniform, AC impedance as a function of frequency. As high performance integrated circuits demand larger currents at higher frequencies with lower power supply voltages, power system design becomes increasingly more challenging. For example, next generation microprocessors will demand peak currents in excess of 100 A and reach operating frequencies of 1 GHz with power supply voltages below 2 V. At such current levels, surge currents and associated excitations of power distribution system resonances can result in significant power supply voltage excursions. Accordingly, reductions in the AC impedance of a power distribution system, particularly inductive components thereof, are desired.

A variety of techniques are available to improve the AC impedance characteristics of a power distribution system. One such technique involves the appropriate placement of decoupling structures/devices, e.g., capacitors, throughout the power distribution system. Others include chip layout with respect to power distribution, use of low inductance packaging technologies such as Controlled Collapse Chip Connection (C4) and Ball Grid Array (BGA) for delivery of supply voltages ($V_{DD}$ and $V_{SS}$), BGA package design and layers, card layout and use of discrete capacitance placed thereon, connector selection and $V_{DD}/V_{SS}$ allocations, regulator choice, and lastly the motherboard layout.

In a typical computer system "Slot 1" configuration, inductances are associated with the vias, traces, connectors, etc. of an integrated circuit carrier (or "package"), of a daughterboard card, and of a motherboard. At low frequencies (i.e., below approximately 100 KHz), impedance of the power supply loop circuit can be made arbitrarily low through the utilization of feedback voltage sensing at the power supply. At very high frequencies, the impedance of the power supply loop circuit can be lowered with the use of on-die capacitance to approximately ($1/\omega C$) where $\omega$ is the angular frequency (such that $\omega=2\pi f$) and C is the capacitance associated with the power supply loop circuit including the on-die capacitance. Unfortunately, in the mid-frequencies (e.g., from approximately 1 MHz to 100 MHz), the AC impedance of the power supply loop circuit is likely to exhibit resonances.

While the impedance at both high- and mid-frequencies can be managed through the use of decoupling capacitors placed strategically in the power supply loop circuit, two significant challenges exist. First, spatial limitations of an integrated circuit chip can limit the amount of capacitance provided on-die. Typically, only portions of the die that are free from device structures will be available for fabrication of on-die capacitors. High-frequency, high-current integrated circuits such as advanced microprocessors may require hundreds of nF of on-die capacitance. Such capacitance typically requires a significant die footprint, since with typical gate oxide thicknesses the capacitance is of the order of 10 nF per mm$^2$. As a result, achieving such added capacitance can adversely affect die size and yield. Even worse, larger capacitances, e.g., $\mu$F, will be required to manage mid-frequency resonances. Second, F although resonance peaks in the impedance at mid-frequencies can be lowered by off-chip decoupling capacitors, the inductive impedance of off-chip portions of the power supply loop circuit typically limits the efficacy of large off-chip capacitors. In general, the series inductance ($L_s$) from the switching circuits of the integrated circuit to the decoupling capacitance ($C_p$) should be low enough that the decoupling capacitance pathway resonance, $$\frac{1}{2\pi\sqrt{C_p L_s}},$$

is in the range of mid-frequency resonances to be mitigated, e.g., 1–100 MHz. Accordingly, power distribution configurations are desired in which large, e.g., tens to thousands nF, can be placed off-chip but with low intervening inductance.

SUMMARY OF THE INVENTION

It has been discovered that providing an integrated circuit chip carrier with a power supply loop having first and second groups of carrier vias arranged in an anti-parallel tessellation advantageously reduces the inductance of a loop circuit associated with the first and second groups of carrier vias. By providing two large-numbered carrier via groups with complementary current flows in an anti-parallel tessellation, the inductance of an electrical pathway between an integrated circuit chip and decoupling capacitance can be greatly reduced. The reduction in the inductance of the electrical pathway allows large off-chip and off-package decoupling capacitance to be used to effectively manage mid-frequency resonances. For example, in one embodiment in accordance with the invention, the inductance of an electrical pathway from decoupling capacitance located on one side of a circuit board, through a circuit board, through a carrier, and to the integrated circuit is less than 60 pH.

In one aspect of the invention, an apparatus includes an integrated circuit carrier, a circuit board, and a loop circuit having a loop inductance. The integrated circuit carrier includes first and second power planes, first and second groups of carrier vias extending from the first and second power planes, respectively, substantially to a first side of the carrier, and third and fourth groups of carrier vias extending from the first and second power planes, respectively, substantially to a second side of the carrier. The circuit board includes first and second groups of circuit board vias extending substantially from a first side of the circuit board towards a second side of the circuit board. The loop circuit is defined from the first group of circuit board vias, through the third group of carrier vias, through the first power plane, through the first group of carrier vias to the first side of the circuit board and back through the second group of carrier vias, through the second power plane, through the fourth group of carrier vias, through the second group of circuit board vias. The carrier vias of the first and second groups are arranged in an anti-parallel tessellation, and the circuit board vias of the first and second groups are arranged in an anti-parallel tessellation.

In another aspect, the invention includes a method of providing a low inductance path through a carrier for an integrated circuit. The method includes positioning first and second power planes between first and second sides of an integrated circuit carrier. The method also includes positioning first and second groups of carrier vias extending from the first and second power planes, respectively, substantially to the first side in an anti-parallel tessellation to reduce a loop inductance associated with the first and second carrier vias for a loop circuit defined from a first group of electrically conductive structures on the second side though the first power plane, through the first group of carrier vias, back through the second group of carrier vias, through the second power plane to a second group of electrically conductive structures on the second side.

In yet another aspect, the invention includes a carrier for providing a low inductance path from an integrated circuit chip to a circuit board. The carrier includes first and second power planes and first and second groups of carrier vias extending from the first and second power planes, respectively, substantially to a first side of the carrier. The carrier also includes third and fourth groups of carrier vias extending from the first and second power planes, respectively, substantially to a second side of the carrier. The carrier has a loop inductance associated with a loop circuit defined from the second side through the third group of carrier vias, through the first power plane, through the first group of carrier vias to the first side and back through the second group of carrier vias, through the second power plane, and through the fourth group of carrier vias to the second side. The carrier vias of the first and second groups are arranged in an anti-parallel tessellation.

In still another aspect of the invention, an integrated circuit chip carrier includes first and second groups of carrier vias extending substantially from a first side of the carrier towards a second side of the carrier. The first and second groups of carrier vias are arranged in an anti-parallel tessellation at a first pitch. The carrier also includes first and second groups of electrically conductive structures on the second side arranged in an anti-parallel tessellation at a second pitch. The first group of carrier vias is electrically coupled to the first group of electrically conductive structures, and the second group of carrier vias is electrically coupled to the second group of electrically conductive structures.

Providing a low inductance electrical pathway from the circuit board to the integrated circuit chip also aids in reducing the inductance of a power supply loop circuit of the integrated circuit chip.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following sets forth a detailed description of the best contemplated mode for carrying out the invention. The description is intended to be illustrative of the invention and should not be taken to be limiting.

Figure 1:
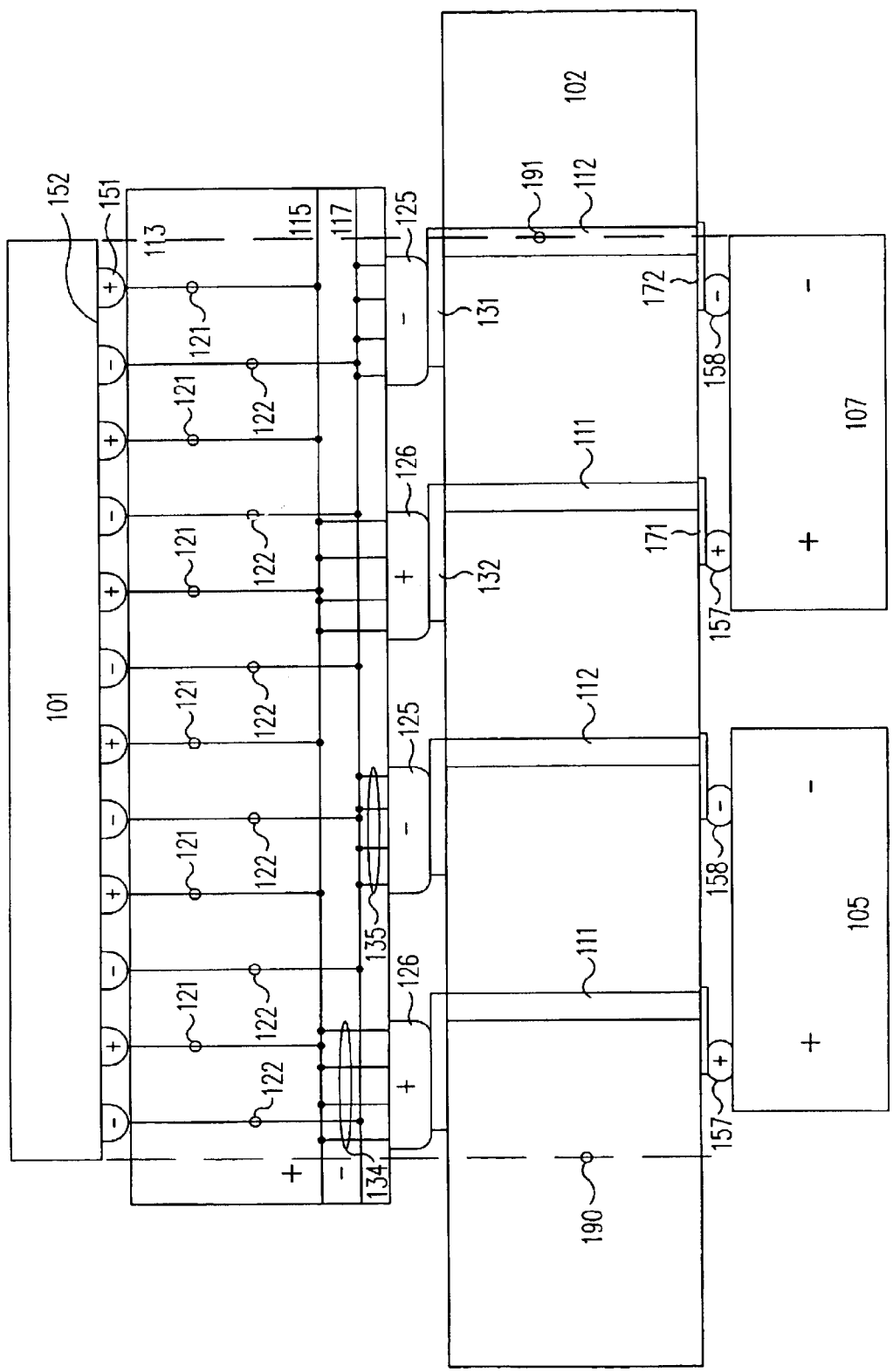
FIG. 1 shows a side cross sectional view of one embodiment of a structure for providing a low inductance path from decoupling capacitance to an integrated circuit chip located on the opposite side of a circuit board from the decoupling capacitance.

FIG. 1 is a side cross sectional view of one embodiment of a structure for providing a low inductance path from decoupling capacitance to an integrated circuit chip located on the opposite side of a circuit board from the decoupling capacitance. Circuit board 102 is a daughterboard card that is packaged for physical and electrical connection to a motherboard of a computer system such as in a "Slot 1" configuration utilized by the PENTIUM II microprocessor available from the INTEL Corporation. In other embodiments, circuit board 102 is the motherboard of a computer system or a daughterboard card of another suitable configuration. In FIG. 1, integrated circuit chip 101 is an x86 compatible microprocessor having an operating frequency of greater than 200 MHz. However other types of integrated circuits may be utilized.

Integrated circuit chip 101 is implemented with flip chip technology. Controlled Collapse Chip Connection (C4) bumps (such as 151 and 152) are located on one side of chip 101 and are used to electrically convey the power, ground, and input/output (I/O) signals to and from the integrated circuit chip 101. With other integrated circuit chips, other types of electrically conductive structures may be used in place of the C4 bumps such as other solder methods or adhesives for example. The number of C4 bumps and the pitch of the C4 bumps on an integrated circuit chip may vary. For example, an integrated circuit chip may have over 1200 C4 power and ground bumps at a pitch in the range of 200–400 µm. With other integrated circuit chips, the number of power C4 bumps and the number of ground C4 bumps each can be in the thousands.

FIG. 1 also shows decoupling capacitors 105 and 107 located on the opposite side of the circuit board 102 from the integrated circuit chip 101. Decoupling capacitors provide decoupling capacitance to the power supply loop circuit that provides power to the integrated circuit chip 101 from a power supply (not shown). The capacitance of the decoupling capacitors reduces the impedance of the loop circuit at mid range frequencies corresponding to the resonance impedance of the power supply loop circuit. The amount of decoupling capacitance located at the bottom side of the circuit board will typically range from 100–5000 nF. However, a greater or lesser amount of decoupling capacitance may be located at the bottom side of the circuit board depending on power distribution system requirements.

In the embodiment of FIG. 1, integrated circuit substrate carrier (carrier) 113 physically and electrically couples the integrated circuit chip 101 to circuit board 102. In general, carriers may also be referred to as substrates, package substrates, or packages. Carrier 113 typically has a thickness of 1 mm between the top side and the bottom side, relative to the view shown in FIG. 1. However, the thickness of the carrier may be greater or less than one millimeter.

Carrier 113 is typically a ball grid array (BGA) carrier; however carrier 113 may also be made of a ceramic material (e.g. a ceramic ball grid array (CBGA) carrier) or of other materials such as laminated plastics (e.g. a plastic ball grid array (PBGA) carrier). Located on the bottom side of the carrier 113, relative to the view shown in FIG. 1, are solder balls (such as 125 and 126). A solder ball is a type of electrically conductive structure used to electrically couple the carrier 113 to the circuit board 102. In other embodiments, other types of electrically conductive structures such as pins may be used such that carrier 113 is a pin grid array (PGA) carrier. In FIG. 1, solder balls 125 and 126 are in electrical contact with contact pads 131 and 132, respectively. Contact pads 131 and 132 are offset pads such that the solder balls 125 and 126 do not reside directly over the circuit board vias 111 and 112 (which in the embodiment shown, are plated through holes). However, contact pads that allow for the solder balls to generally reside over the circuit board vias (direct contact pads) may also be used. Although direct contact pads may be more expensive, such contact pads provide a loop circuit with a lower inductance than with offset pads. In addition, direct contact pads occupy less surface space on the circuit board and therefore allow for the placement of a greater number of plated through holes per area of circuit board.

Within carrier 113 are two lateral conductors, which in FIG. 1, are two power planes, ground plane 117 and voltage plane 115. Lateral conductors such as power planes 115 and 117 enable carrier 113 to provide and receive power and ground signals to and from integrated circuit 101 on one side of the carrier 113 at one pitch and to receive and provide power and ground signals to and from circuit board 102 at a different pitch. With other carriers, other types of lateral conductors may be located within the carrier such as patches (see FIG. 8), traces, or tracing layers. Each power plane has a thickness of 0.8 mils. With other circuit boards, the power planes may have other thicknesses such as 1.6 mils.

Carrier 113 includes a plurality of carrier vias (such as carrier vias 121 and 122) which are electrically conductive paths in the carrier. These carrier vias extend from the first surface (or in other embodiments from contact pads on the first surface) of the carrier 113 to other areas of the carrier. Some of the carrier vias (not shown in FIG. 1) of carrier 113 are used to convey input/output signals (I/O) signals to and from the integrated circuit chip 101 to other portions in the computer system or electronic device that incorporates integrated circuit chip 101. The I/O carrier vias are coupled to I/O solder balls on the bottom side of the carrier (see FIG. 6). In some carriers, the I/O carrier vias are electrically coupled to the I/O solder balls by internal I/O planes or signal layers in the carrier 113. Carrier vias 121 and 122 electrically couple the power bumps 151 and ground bumps 152, respectively, to the voltage plane 115 and ground plane 117, respectively.

A second group of carrier vias 134 and 135 electrically couples the power planes 115 and 117 to the power and ground solder balls 126 and 125, respectively. In FIG. 1, each solder ball is electrically coupled to one of the power planes by a subgroup of carrier vias (such as subgroups 134 and 135). Electrically coupling a solder ball to a power plane with a subgroup of carrier vias reduces the inductance of the electrical coupling by providing multiple parallel paths between the solder ball and power plane.

Although in FIG. 1, voltage 115 and ground 117 planes are illustrated as co-extensive with the horizontal area of carrier 113 (save the perforations for carrier vias 122 and 134), the power planes in other carriers in accordance with the present invention may have a lesser degree of co-extensiveness. For example, such power planes may extend only across the area occupied by the power and ground carrier vias or may be segmented.

The positive electrodes 157 of capacitors 105 and 107 are electrically coupled to the voltage power plane of carrier 113 by plated through holes 111, solder balls 126 and carrier via subgroups 134. The negative electrodes 158 of capacitors 105 and 107 are electrically coupled to the ground plane 117 of carrier 113 by plated through holes 112, solder balls 125, and carrier via subgroups 135.

In other embodiments, plated through holes 111 and 112 are electrically coupled to power planes (not shown) such as a voltage plane and a ground plane that are internal to the circuit board. These power planes are electrically coupled to a power supply (not shown) that supplies power to the integrated circuit chip 101 at regulated voltages such as 1.5 VDC. In an embodiment that includes internal power planes in the circuit board, plated through holes 111 are electrically connected to the internal voltage plane (not shown) of the circuit board and plated through holes 112 are electrically connected to the internal ground plane (not shown) of the circuit board. In some circuit boards, the plated through holes extend from the offset pads 131 and 132 and terminate at the internal power planes (not shown). Other groups of plated through holes then electrically couple capacitors 105 and 107 to the internal power planes of the circuit board.

In FIG. 1, the C4 power and ground bumps 151 and 152, the power and ground carrier vias 121 and 122, the power and ground carrier via subgroups 134 and 135, the power and ground solder balls 126 and 125, the contact pads 132 and 131, the power and ground plated through holes 111 and 112, the contact pads 171 and 172, and the positive and negative electrodes 157 and 158 are arranged in anti-parallel tessellations to reduce the inductance of the loop circuit from the decoupling capacitors to the integrated chip circuit. An anti-parallel tessellation includes an arrangement of multiple, parallelly oriented conductive structures (e.g. C4 bumps, carrier vias, plated through holes, solder balls, etc.) of a loop circuit wherein the current flow of the loop circuit through a first group of the conductive structures is in an opposing direction to the current flow through a second group of the conductive structures and wherein the arrangement provides for a reduction in the inductance of the loop circuit due to the mutual coupling among the conductive structures of the two groups and due to the multiple parallel conductive structures of each group. FIGS. 2-6 include depictions of exemplary anti-parallel tessellations of conductive structures. However, based upon the descriptions herein, those skilled in the art will appreciate other suitable arrangements of anti-parallel tessellations.

Arranging conductive structures of an electrical pathway to an integrated circuit in an anti-parallel tessellation allows for a reduction in the inductance of the electrical pathway due to the utilization of mutual coupling and multiple conductive paths. Increasing the mutual coupling between conductors in a loop circuit decreases the inductances of the loop circuit associated with the conductors. In a loop circuit that includes two conductors, the inductance of the loop circuit associated to the two conductors is:

$$L_{total} = L_1 + L_2 - 2 * M_{12};$$

where $L_1$ and $L_2$ are the inductances of the first and second conductors, respectively, and $M_{12}$ is the mutual coupling between the first conductor and the second conductor. The value of the mutual coupling $M_{12}$ is dependent upon the geometrical arrangement between the two conductors such as the degree and length of the anti-parallel current flow of the two conductors and the distance between the anti-parallel lengths.

Increasing the number of parallel conductors of a pathway carrying current flowing in the same direction decreases the inductance of the pathway. For example:

$$L_{total} = \frac{L_1 * L_2}{(L_1 + L_2)};$$

For a circuit having multiple parallel conductors having current flow in the same direction, where each parallel conductor has approximately the same inductance ($L_{average}$):

$$L_{total} = \frac{L_{average}}{N \text{ of parallel conductors}}$$

Figure 2:
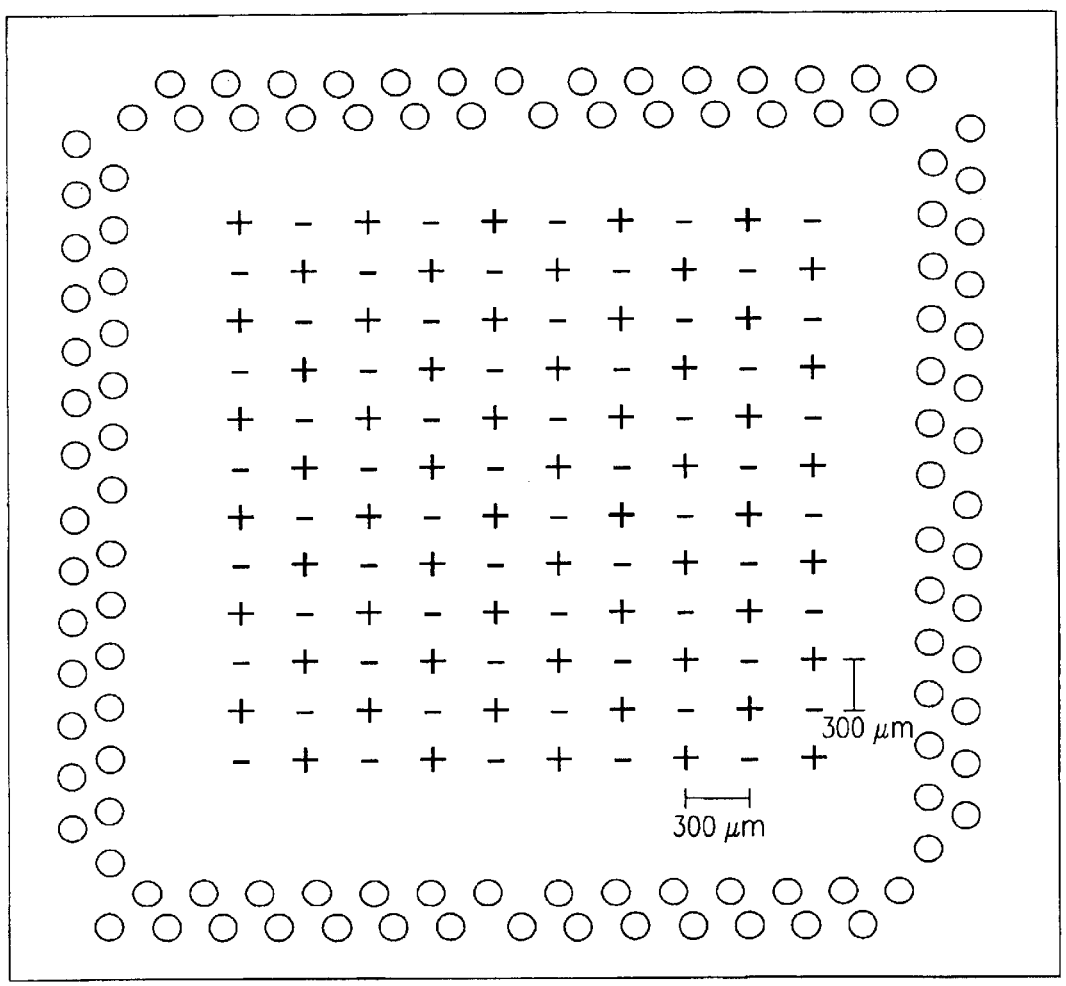
FIG. 2 shows one embodiment of a top view, relative to the view shown in FIG. 1, of a carrier whose power and ground carrier vias are arranged in an exemplary anti-parallel tessellation to reduce the inductance associated with the carrier vias in an electrical loop circuit.

FIG. 2 shows one embodiment of a top view, relative to the view shown in FIG. 1, of a carrier whose power and ground carrier vias are arranged in an anti-parallel tessellation to reduce the inductance associated with the carrier vias in an electrical loop circuit. In FIG. 2, the power and ground carrier vias (designated by the "+" and "−" symbols, respectively) are arranged in a "checkerboard" pattern of 12 horizontal rows by 10 vertical rows (relative to the view shown in FIG. 2). The anti-parallel tessellation pattern of FIG. 2 also has alternating rows of power and ground carrier vias in diagonal orientations. The carrier of FIG. 2 also includes I/O carrier vias (designated by the open circles) surrounding the perimeter of the anti-parallel tessellation of the power and ground carrier vias. The I/O carrier vias convey I/O signals to and from the integrated circuit chip.

The vertical and horizontal rows of alternating power and ground carrier vias have a center-to-center separation of approximately 300 μm. In other carriers, the center-to-center separation is in the range of 200–400 μm. However, the center-to-center separation between the rows, or individual carrier vias may be greater or smaller. In general, decreasing the spacing between power and ground carrier vias having an anti-parallel current flow increases the mutual coupling and thereby decreases the inductance of a loop circuit associated with the power and ground carrier vias.

Positioning the power and ground carrier vias in a checkerboard patterned anti-parallel tessellation enables the carrier to incorporate two large groups of parallel carrier vias in an arrangement to reduce the inductance of a loop circuit associated with the two groups of carrier vias. Each interior carrier via of the pattern in FIG. 1 is in closest proximity to four carrier vias of the opposite group having an anti-parallel or opposing current flow. In general, the greater the intermingling of carrier vias of the first and second groups, the greater the total mutual coupling effect of the arrangement.

For a loop circuit defined from the voltage plane, through the power carrier vias to the top of the carrier and back though the ground carrier vias to the ground plane where the power and ground carrier vias are arranged in an anti-parallel tessellation, the inductance of the loop circuit associated with the power and ground carrier vias approximates:

$$L_{(p+g)} = \frac{L_{poweraverage}}{N \text{ power vias}} + \frac{L_{groundaverage}}{N \text{ ground vias}} - \frac{4 * M_{effective}}{(N \text{ power vias} + N \text{ ground vias})}$$

N power vias=N ground vias;

wherein $L_{(p+g)}$ is the inductance of a loop circuit associated with the power and ground carrier vias and $L_{poweraverage}$ and $L_{groundaverage}$ are the average inductances of a power and a ground carrier via, respectively, of the pattern. $M_{effective}$ is the effective mutual coupling of a hypothetical carrier via pair having anti-parallel current flow in the pattern. In a pattern consisting of one ground and one power carrier via, $M_{effective}$ is the mutual coupling between the pair. However, since the power and ground carrier vias in an anti-parallel tessellation are in proximity to multiple carrier vias having anti-parallel current flow, $M_{effective}$ includes mutual coupling from multiple carrier vias having anti-parallel current flow.

Where $L_{poweraverage}$ approximately equals $L_{groundaverage}$ (designated as $L_{average}$) and $M_{effective}$ is expressed in terms of $L_{average}$, the total inductance due to the power and ground carrier vias approximates:

$$L_{(p+g)} = \frac{4(1-K)L_{average}}{(N \text{ power vias} + N \text{ ground vias})}, K = \frac{M_{effective}}{L_{average}}$$

where K represents the K factor of the pattern which is effective mutual coupling of a hypothetical carrier via pair having anti-parallel circuit flow divided by the average inductance of a carrier via.

As shown by the above formula, the total inductance associated with the power and ground carrier vias may be increased or decreased by decreasing or increasing the number of parallel carrier vias or by decreasing or increasing the K factor of the anti-parallel tessellation. The K factor is dependent upon the center-to-center distances between the carrier vias having anti-parallel current flows as well as the specific geometric pattern of the anti-parallel tessellation. In general, the closer the spacing between the power and ground carrier vias, the higher the K factor. Also, in general, increasing the intermingling of the carrier vias of the first and second groups also increases the K factor.

The checkerboard pattern shown in FIG. 2 may have₁an effective mutual coupling of greater than 0.9 $L_{average}$ (K>0.9). In some embodiments, the mutual coupling is above 0.99 $L_{average}$ However, in other embodiments, the K factor may be less than 0.9. For a 10×12 pattern with an effective mutual coupling of 0.9 $L_{average}$, the inductance of a loop circuit associated with the first and second carrier vias is 0.0033 $L_{average}$ For K =0.8, the total inductance=0.0067 $L_{average}$. In some embodiments, the average inductance of a carrier via in a carrier ranges from 120 to 160 pH.

Figure 3:
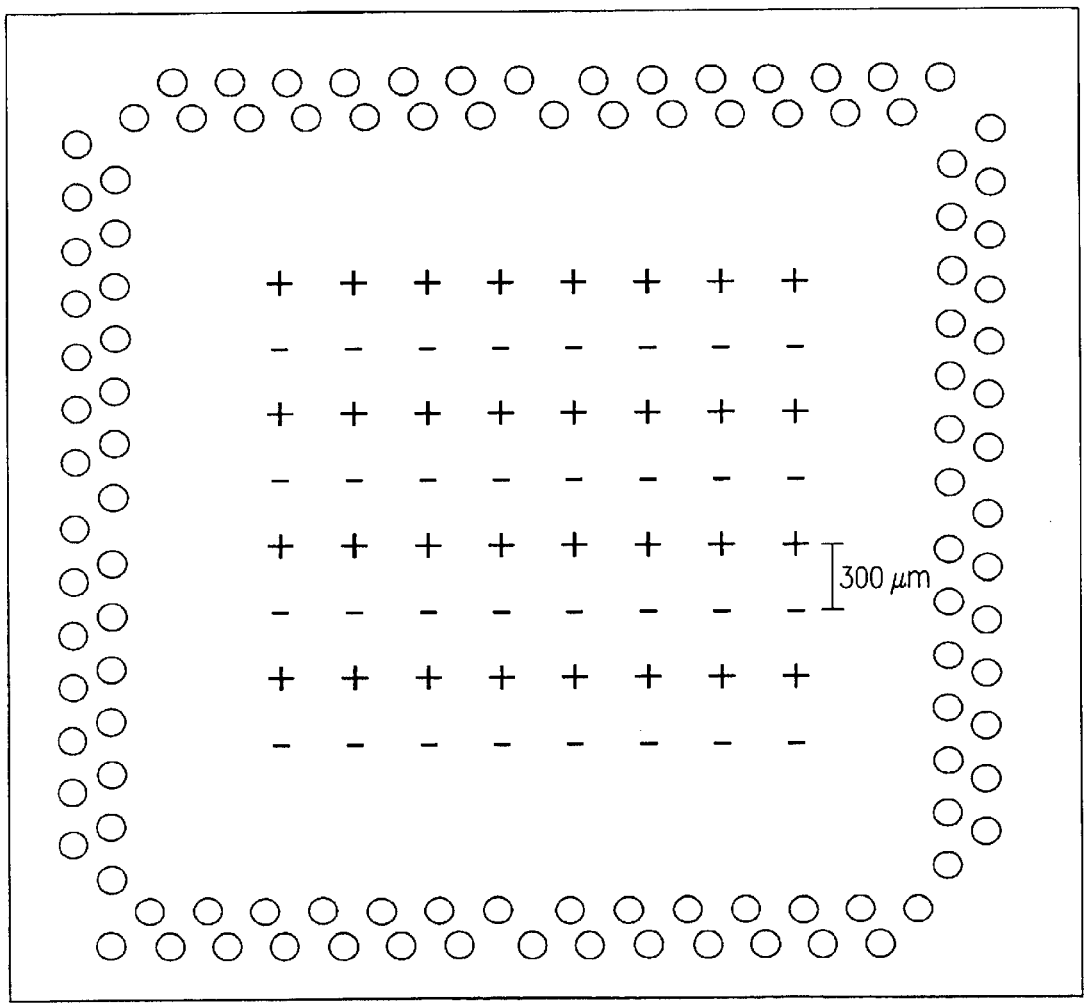
FIG. 3 shows one embodiment of a top view, relative to the view shown in FIG. 1, of a carrier whose power and ground carrier vias are arranged in another exemplary anti-parallel tessellation to reduce the inductance associated with the carrier vias in an electrical loop circuit.

FIG. 3 shows one embodiment of a top view, relative to the view shown in FIG. 1, of a carrier whose power and ground carrier vias are arranged in an anti-parallel tessellation to reduce the inductance associated with the carrier vias in an electrical loop circuit. In FIG. 3, 32 power and 32 ground carrier vias are arranged in alternating rows of power carrier vias and ground carrier vias. The center-to-center spacing between a row of power carrier vias and a row of ground carrier vias is approximately 300 μm. The K factor for the anti-parallel tessellation shown in FIG. 3 is less than the K factor for FIG. 2 in that the interior power and ground carrier vias are in closest proximity to only two carrier vias of the other group. The anti-parallel tessellation of FIG. 3 has rows of alternating power and ground carrier vias in diagonal orientations.

Figure 4:
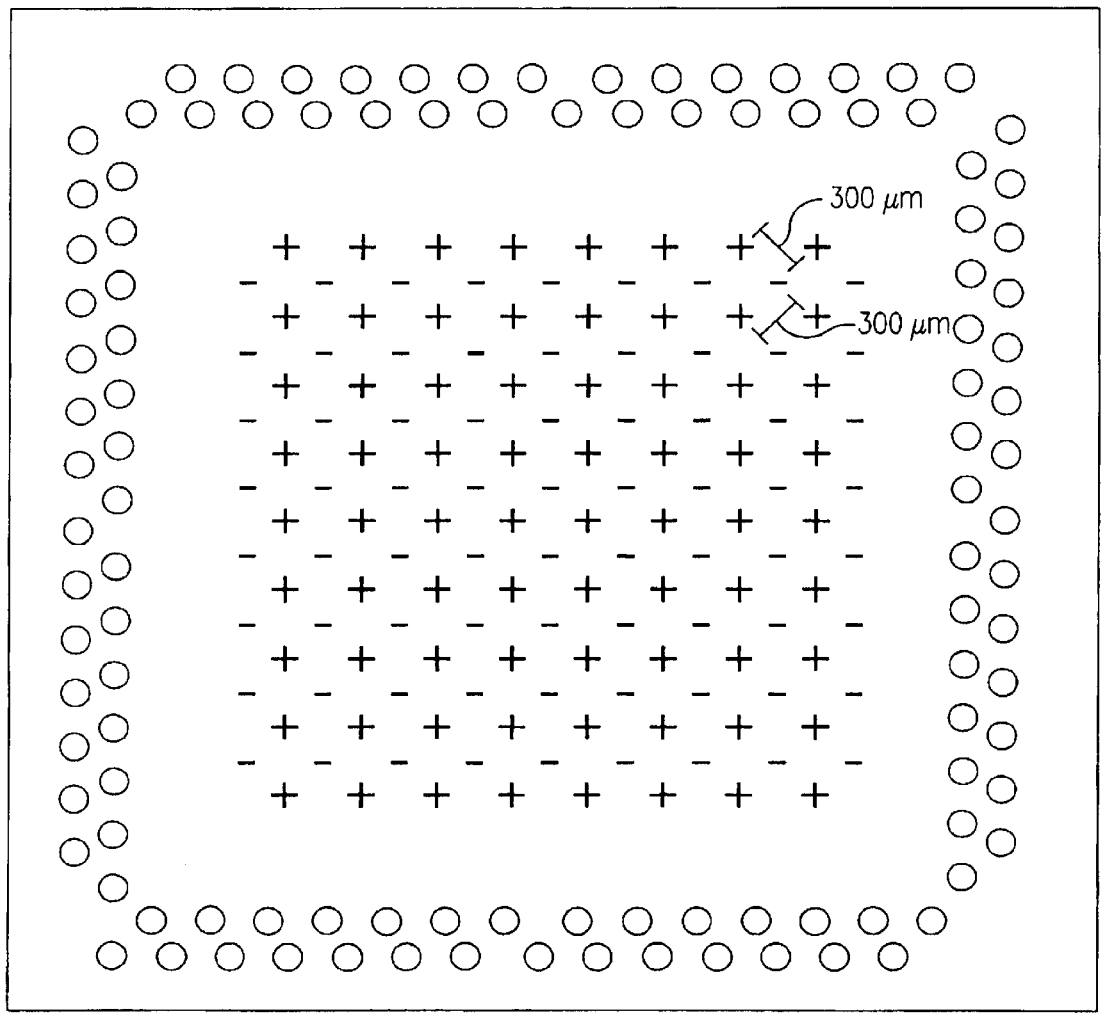
FIG. 4 shows one embodiment of a top view, relative to the view shown in FIG. 1, of a carrier whose power and ground carrier vias are arranged in yet another exemplary anti-parallel tessellation to reduce the inductance associated with the carrier vias in an electrical loop circuit.

FIG. 4 shows one embodiment of a top view, relative to the view shown in FIG. 1, of a carrier whose power and ground carrier vias are arranged in an anti-parallel tessellation to reduce the inductance associated with the carrier vias in an electrical loop circuit. In FIG. 4, the power and ground carrier vias are arranged in alternating rows of nine rows of eight power carrier vias and eight rows of nine ground carrier vias. The alternating rows of power and ground carrier vias are staggered so as to define a checkerboard pattern with a diagonal orientation.

Figure 5:
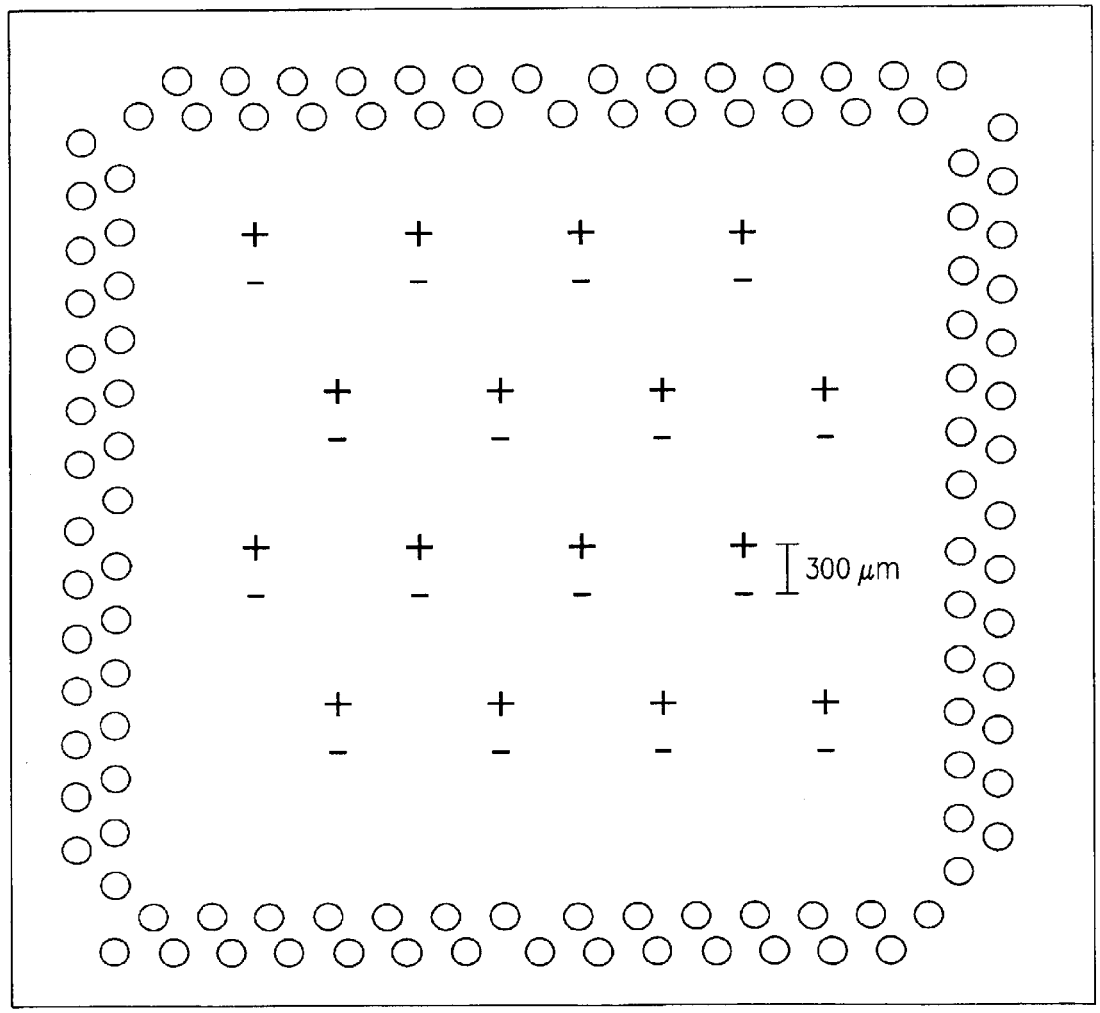
FIG. 5 shows one embodiment of a top view, relative to the view shown in FIG. 1, of a carrier whose power and ground carrier vias are arranged in still another exemplary anti-parallel tessellation to reduce the inductance associated with the carrier vias in an electrical loop circuit.

FIG. 5 shows one embodiment of a top view, relative to the view shown in FIG. 1, of a carrier whose power and ground carrier vias are arranged in an anti-parallel tessellation to reduce the inductance associated with the carrier vias in an electrical loop circuit. In FIG. 5, the power and ground carrier vias are arranged in rows of carrier via pairs. The center-to-center distance between each carrier via of the pair is approximately 300 μm. The K factor for the pattern of FIG. 5 is less than the patterns of FIGS. 2, 3 and 4 in that each carrier via is in closest proximity to only one carrier via of the opposite group.

It is understood that the anti-parallel tessellations shown in FIGS. 2–5 may include a greater or lesser number of power and ground carrier vias than shown in those Figures. For example, a carrier may have 100 rows of 120 power and ground carrier vias. With other carriers, the power and ground carrier vias may each number in the thousands. In general, the greater the number of parallel power and ground carrier vias, the greater the reduction in the inductance of a loop circuit associated with the power and ground carrier vias. Accordingly, it is desirable to position as many power and ground carrier vias as practical in an anti-parallel tessellation in the carrier. For the carriers of FIGS. 2–5, the center-to-center spacings between adjacent power and ground carrier vias and/or adjacent carrier via rows may also be greater or smaller. For example, the center-to-center spacings may be in the range of 200–400 μm. Furthermore, the anti-parallel tesselations described herein are merely illustrative and based on this description those of skill in the art will appreciate a wide variety of sortable variations. For example, and without limitation, power and ground carrier vias may be arranged in other anti-parallel tessellation patterns such as patterns having rings of alternating carrier vias or alternating rings of power and ground carrier vias. In other embodiments, the rows of carrier vias may have curved or wavy forms.

Figure 6:
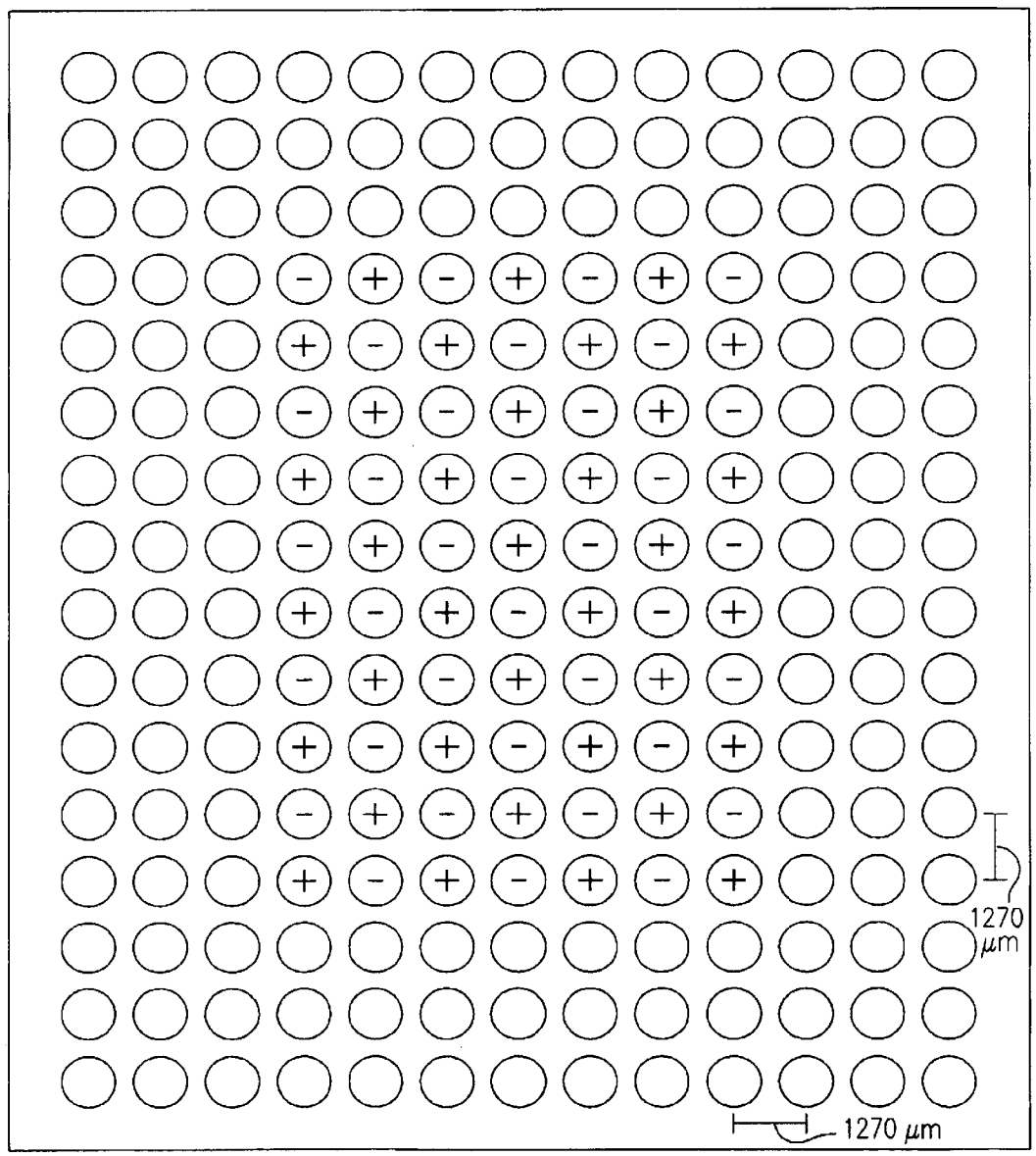
FIG. 6 shows one embodiment of a bottom view, relative to the view shown in FIG. 1, of a carrier having solder balls on the bottom side arranged in an exemplary anti-parallel tessellation to reduce the inductance associated with the conductive structures in an electrical loop circuit.

FIG. 6 shows one embodiment of a bottom view, relative to the view shown in FIG. 1, of a carrier having power and ground electrically conductive structures located on the bottom side arranged in an anti-parallel tessellation to reduce the inductance associated with the electrically conductive structures in an electrical loop circuit. The electrically conductive structures located on the bottom side of the carrier in FIG. 6 are solder balls. The carrier of FIG. 6 has 16 rows of 13 solder balls located on the bottom side for electrically coupling the carrier to a circuit board. The solder ball arrangement has a pitch of 1270 μm. With some carriers, the pitch may range from 600–1500 μm. With other carriers, the pitch may be greater or smaller. The power and ground solder balls (designated with the "+" and "−" symbols, respectively) are arranged in a checkerboard patterned anti-parallel tessellation to reduce the inductance in a loop circuit associated with the power and ground solder balls. The carrier in FIG. 6 also includes I/O solder balls (designated by the open circles) located around the perimeter of the power-ground anti-parallel tessellation. With some carriers, power and/or ground solder balls may be located around the perimeter of the anti-parallel tessellation.

As with the anti-parallel tessellation of the carrier vias, the inductance in a loop circuit associated with the power and ground solder balls approximates:

$$L_{(p+g)} = \frac{4(1-K)L_{average}}{(Np + Ng)}$$

where $L_{(P+g)}$ is the inductance of a loop circuit associated with the power and ground solder balls and K is the K factor for the anti-parallel tessellation which is the effective mutual coupling of a hypothetical solder ball pair having anti-parallel current flow divided by the average inductance of a solder ball. Np is the number of power solder balls in the tessellation and Ng is the number of ground solder balls in the tessellation. As with the power and ground carrier vias, as shown by the above formula, the total inductance associated with the power and ground solder balls may increased or decreased by decreasing or increasing the number of parallel power and ground solder balls or by decreasing or increasing the K factor of the anti-parallel tessellation of solder balls.

As with the power and ground carrier vias as shown in FIGS. 2–5, the power and ground solder balls may be arranged in a variety of other anti-parallel tessellation patterns such as the patterns shown in FIGS. 3, 4, and 5 or such as a pattern having alternating rings. In general, the greater the intermingling of power and ground solder balls, the greater the K factor. Also in general, the smaller the spacings between power and ground solder balls, the greater the K factor. In other embodiments, the number of power and ground solder balls in the anti-parallel tessellation may be varied. In some embodiments, the power and ground solder balls may number in the hundreds. In general, the greater the number of parallel power and ground solder balls, the greater the reduction in the inductance of a loop circuit associated with the power and ground solder balls. Accordingly, it is desirable to position as many power and ground solder balls as practical in an anti-parallel tessellation on the carrier.

In an embodiment where the carrier has 60 power and 60 ground solder balls arranged in an anti-parallel tessellation having a K factor of 0.7, the inductance of a loop circuit associated with the power and ground solder balls is 0.01 the average inductance of a solder ball.

In one embodiment, each power and ground solder ball of FIG. 6 is electrically coupled to the voltage and ground planes, respectively (similar to items 115 and 117 of FIG. 1) by subgroups of power carrier vias and subgroups of ground carrier vias, respectively (similar to items 134 and 135 of FIG. 1). In one embodiment, these carrier vias extend directly from the power planes to the solder balls wherein the subgroups are arranged in an anti-parallel tessellation matching that of the solder balls. In one embodiment, each subgroup includes 6 carrier vias. However, in other embodiments, the number of carrier vias per subgroup may be more or less. In general, the greater the number of carrier vias per subgroup, the greater the reduction in the inductance of a loop circuit associated with the carrier via subgroups.

Referring back to FIG. 1, for a carrier having power and ground carrier via subgroups (such as items 134 and 135) electrically coupling the voltage and ground planes (115 and 117), respectively, to power and ground solder balls (126 and 125) respectively, the inductance of a defined loop circuit associated with the upper power and ground carrier vias (121 and 122) and the lower carrier via subgroups (134 and 135) may be reduced by locating the power planes 115 and 117 as close to the power and ground solder balls as possible so as to minimize the length of the carrier via subgroups 134 and 135 and maximize the length of the upper power and ground carrier vias 121 and 122 in the carrier 113. The inductance per length of the upper carrier vias 121 and 122 in an anti-parallel tessellation is less than the inductance per length of the carrier vias subgroups 134 and 135 in an anti-parallel tessellation due to the fact that the upper carrier vias 122 and 121 are arranged at a smaller pitch which enables more carrier vias to be located within a square unit than with the pitch of the carrier via subgroups 134 and 135. Also, because individual carrier vias of the upper power and ground carrier vias 121 and 122 can be individually alternated in an anti-parallel tessellation, the K factor for the anti-parallel tessellation of the upper carrier vias 121 and 122 is larger than with the anti-parallel tessellation of the carrier via subgroups 134 and 135.

Referring back to FIG. 1, the power and ground solder balls (items 125 and 126 located on the bottom side, relative to the view shown in FIG. 1) are electrically coupled to the electrodes 157 and 158, respectively, by plated through holes 111 and 112 extending from offset pads 132 and 131 on the top side of circuit board 102 to offset pads 171 and 172 on the bottom side of circuit board 102, relative to the view shown in FIG. 1. The power and ground plated through holes 111 and 112 are also arranged in an anti-parallel tessellation to reduce the inductance in a loop circuit associated with the plated through holes. In one embodiment, the plated through holes are arranged in a checkerboard pattern similar to the power and ground solder balls in FIG. 6. In other embodiments, the power and ground plated through holes are arranged in other anti-parallel tessellation patterns such as those similar to FIGS. 3, 4, and 5. The number of plated-through holes in a circuit board may vary. With some circuit boards, the power and ground plated through holes may number in the hundreds.

As with the anti-parallel tessellation of the carrier vias and solder balls, the inductance in a loop circuit associated with the power and ground plated through holes approximates:

$$L_{(p+g)} = \frac{4(1-K)L_{average}}{(Np+Ng)};$$

wherein $L_{(p+g)}$ is the inductance of a loop circuit associated with the power and ground plated through holes and K is the K factor for the anti-parallel tessellation which is the effective mutual coupling of a hypothetical plated through hole pair having anti-parallel current flow divided by the average inductance of a plated through hole.

As with the power and ground carrier vias, as shown by the above formula, the total inductance associated with the power and ground plated through holes may increased or decreased by decreasing or increasing the number of power and ground parallel plated through holes or by decreasing or increasing the K factor of the anti-parallel tessellation. In general, the greater the intermingling of power and ground plated through holes, the greater the K factor of the pattern. Also in general, the smaller the spacings between power and ground plated through holes, the greater the K factor. Furthermore, the greater the number of parallel power and ground plated through holes, the greater the reduction in the inductance of a loop circuit associated with the power and ground plated through holes. Accordingly, it is desirable to position as many power and ground plated through holes as practical in an anti-parallel tessellation in a circuit board.

In FIG. 1, each power and ground plated through hole 111 and 112 is electrically coupled to a single power or ground solder ball located on the bottom side of carrier 113. Also in FIG. 1, the anti-parallel tessellation pattern of the power and ground plated through holes matches the anti-parallel tessellation pattern of the power and ground solder balls.

For a circuit board having 40 power and 40 ground plated through holes arranged in an anti-parallel tessellation having a K factor of 0.7, the inductance of a loop circuit associated with the power and ground plated through holes is 0.015 the average inductance of a plated through hole.

In some embodiments where the circuit board 102 includes internal power planes (not shown), the circuit board may include two sets of power and ground plated through holes. One set extends from the top side to the internal power planes of the circuit board and the other set extends from the internal power planes to the bottom side of the circuit board. Each set of power and ground plated through holes would be arranged in an anti-parallel tessellation to reduce the inductance in a loop circuit associated with each set.

Figure 7:
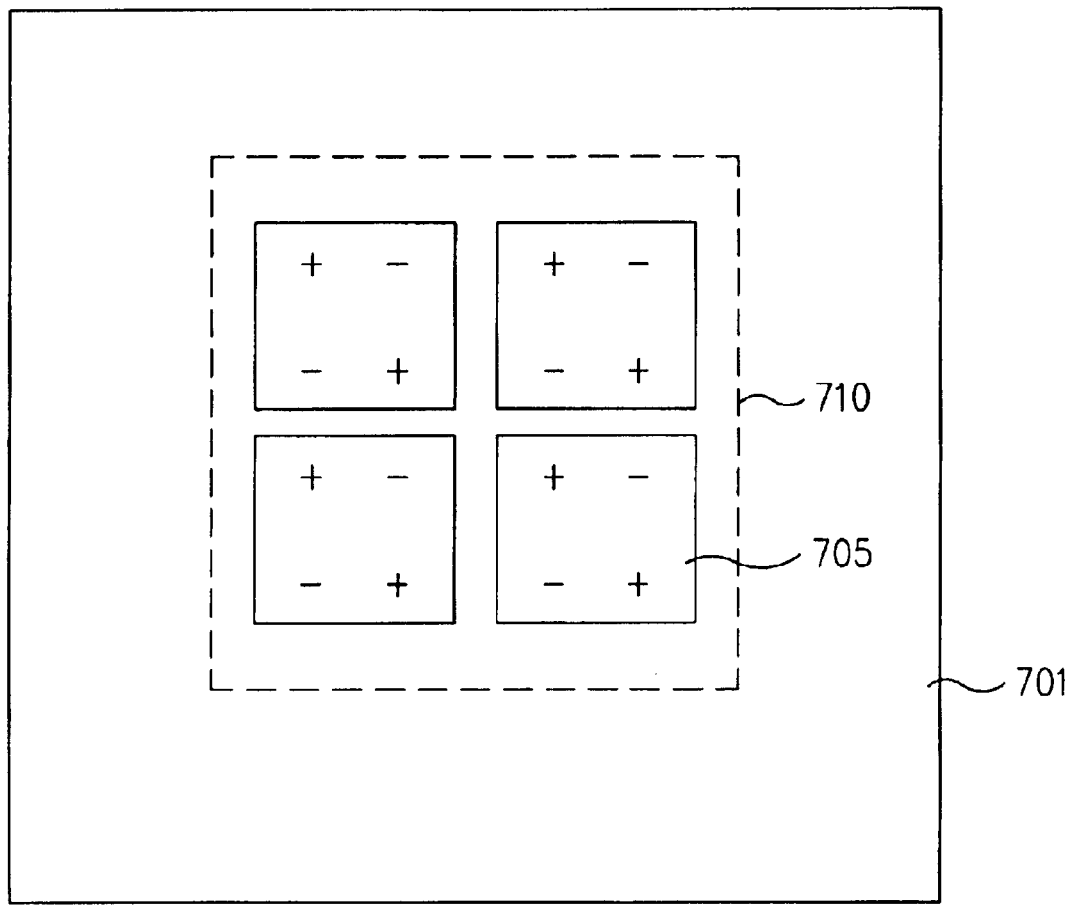
FIG. 7 shows one embodiment of a bottom side of a circuit board, relative to the view shown in FIG. 1.

FIG. 7 shows the bottom side of a circuit board, relative to the view shown in FIG. 1. Located on the bottom side of circuit board 701 are decoupling capacitors 705 electrically coupled in parallel and having positive and negative electrodes extending from the capacitors towards contact pads located on the bottom side of circuit board 701. In FIG. 7, the "+" and "−" symbols represent the location of the positive and negative electrodes with respect to the circuit board. Each capacitor 705 includes two positive and two negative electrodes. However, the number of electrodes per capacitor may vary. With some configurations, the positive and negative electrodes may number in the hundreds. In one embodiment, the positive electrodes and negative electrodes include solder balls (similar to items 157 and 158) for electrically contacting offset pads on the circuit board. In other embodiments, the solder balls electrically contact pads located directly between the plated through holes and the electrodes. Although FIG. 7 shows 4 capacitors, the number of capacitors located on the bottom side and the size of those capacitors may vary. In one example, twenty 0.1 μF capacitors are located on the bottom side of the circuit board to provide 2 μF of decoupling capacitance.

The capacitors 705 are arranged on the circuit board 701 in a pattern so that the positive and negative electrodes are arranged in an anti-parallel tessellation to reduce the inductance associated with the electrodes for a loop circuit defined from the positive electrodes, through the power plated through holes to the top side of circuit board and back through the ground plated through holes to the negative electrodes. This reduction in inductance reduces the inductance of the electrical pathway between the integrated circuit chip 101 and the decoupling capacitance provided by capacitors 705.

As with the anti-parallel tessellation of the carrier vias, solder balls, and plated through holes, the inductance in a loop circuit associated with the positive and negative electrodes approximates:

$$L_{(p+n)} = \frac{4(1-K)L_{average}}{(Np+Ng)};$$

wherein $L_{(p+n)}$ is the inductance of a loop circuit associated with the positive and negative electrodes and K is the K factor for the anti-parallel tessellation which is the effective mutual coupling of a hypothetical electrode pair having anti-parallel current flow divided by the average inductance of an electrode. As with the power and ground carrier vias, as shown by the above formula, the total inductance associated with the positive and negative electrodes may increased or decreased by decreasing or increasing the number of parallel conductors or by decreasing or increasing the K factor of the anti-parallel tessellation.

As with the power and ground carrier vias as shown in FIGS. 2–5, the positive and negative electrodes may be arranged in various anti-parallel tessellation patterns such as the patterns shown in FIGS. 2, 3, 4, and 5. In one configuration, the anti-parallel tessellation pattern of the positive and negative electrodes matches or is similar to the anti-parallel tessellation of the power and ground plated through holes of the circuit board in which the positive and negative electrodes are electrically coupled. The number of positive and negative electrodes may be varied. In general, the greater the number of electrodes, the greater the reduction in the inductance of a loop circuit associated with those electrodes. In a configuration having 40 positive and 40 negative electrodes arranged in an anti-parallel tessellation having a K factor of 0.6, the inductance of a loop circuit associated with the power and ground electrodes through holes is 0.02 the average inductance of an electrode.

Dashed line 710 on FIG. 7 indicates the position of the integrated circuit chip on the opposite side of the circuit board 701. In the embodiment shown, the decoupling capacitors are positioned on the circuit board 701 within the area occupied by the integrated circuit chip on the opposite side of the circuit board. Positioning the decoupling capacitors within the occupied area aids in minimizing the length and therefore the inductance of the electrical pathway from the decoupling capacitors, through the circuit board and carrier, to the integrated circuit chip. It is also desirable to position the power and ground carrier vias, the power and ground solder balls, and the power and ground plated through holes within the occupied area to reduce the inductance associated with those structures by reducing the physical length of the electrical pathway. See dashed lines 190 and 191 on FIG. 1 indicating the area occupied by the integrated circuit chip 101.

Referring back to FIG. 1, for an integrated circuit chip having 800 power and 800 ground C4 bumps (similar to items 151 and 152) arranged in a checkerboard anti-parallel tessellation and having a pitch of 360 μm, the inductance associated with the power and ground C4 bumps is approximately 0.04 pH. For a carrier having 800 power and 800 ground carrier vias arranged in a checkerboard patterned anti-parallel tessellation at a pitch of 360 μm and extending approximately 1 mm from contact pads on the upper surface of the carrier towards the bottom surface, the inductance associated with the power and ground carrier vias is 0.6 pH. For a carrier having 40 power and 40 ground solder balls 900 μm in diameter at a pitch of 1270 μm and arranged in a checkerboard patterned anti-parallel tessellation, the inductance associated with the solder balls is 4.7 pH. For a circuit board having 40 power and 40 ground plated through holes having a length of 1.57 mm arranged in a checkerboard patterned anti-parallel tessellation and a pitch of 1270 μm, the inductance associated with the plated through holes is 25 pH.

Referring back to FIG. 1, carrier 113 may include more than one voltage and/or more than one ground plane located within the carrier. In some carriers with additional power planes, the power and ground carrier vias 121 and 122 are electrically connected to the additional power planes in the carrier. However, in other embodiments, the power and ground carrier vias 121 and 122 are not electrically connected to the additional power planes. In these embodiments, the carrier vias 121 and 122 extend through holes in the additional power planes that are located within the carrier 113 between the integrated circuit 101 and the voltage and ground planes 115 and 117.

Figure 8:
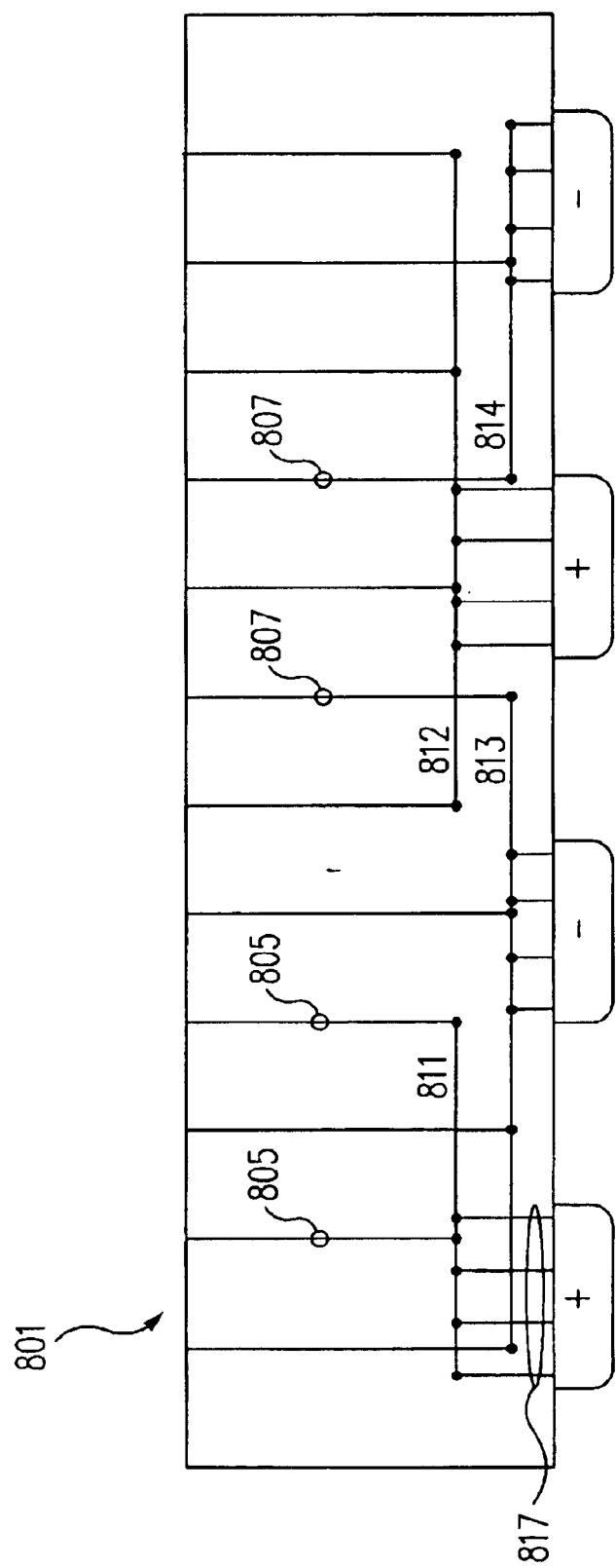
FIG. 8 shows a side cross sectional view of an embodiment of an integrated circuit chip carrier. The use of the same reference symbols in different drawings indicates similar or identical items.

FIG. 8 shows a side cross sectional view of another embodiment of an integrated circuit chip carrier. Carrier 801 includes a plurality of power "patches" (such as 811 and 812) and a plurality of ground patches (such as 813 and 814) which enable carrier 801 to provides and receive power and ground signals to and from the top side of the power plane at one pitch and to provide and receive power and ground signals to and from the bottom side of carrier 801 at a second pitch. A patch is a lateral conductor that is similar to a mini power plane. In FIG. 8, each patch is electrically connected to a subgroup of carrier vias and is electrically connected to the power or ground vias located within the area of which the patch is co-extensive. It is understood that patches 811–814 extend into the page of FIG. 8.

In still other embodiments, the integrated circuit chip carrier does not include any lateral power or ground conductors. In these embodiments, the power and ground carrier vias extend from the top surface to electrically conductive structures on the bottom surface, relative to the views shown in FIGS. 1 and 8.

Providing a low inductance path from decoupling capacitance located on one side of a circuit board or carrier to an integrated circuit located on the opposite side of the circuit board or carrier allows for the placement of an effective amount of decoupling capacitance on the opposite side of the carrier from the integrated circuit. One advantage of locating an effective amount of decoupling capacitance on the opposite side of the carrier is that the amount of decoupling capacitance required to be placed within the carrier may be significantly reduced. This advantageously allows for the minimization of the number of voltage and ground planes in the carrier which can cause resonance impedances at frequencies below 1 GHz. A reduced requirement of decoupling capacitance within the carrier also allows for an increase in the spacing between the voltage and ground planes 115 and 117 (such as 1.6 to 8 mills) and allows for the use of lower, less dielectric material to be located between the planes 115 and 117 such as alumina ($Al_2O_3$) having a dielectric constant of 10.

While particular embodiments of the present invention have been shown and described, it will be obvious to those skilled in the art that changes and modifications may be made without departing from this invention and its broader aspects and, therefore, the appended claims are to encompass within their scope all such changes and modifications as are within the true spirit and scope of this invention.

What is claimed is:

1. An apparatus comprising:
   an integrated circuit carrier including:
      first and second groups of carrier vias extending substantially from a first side of said carrier towards a second side of said carrier;
   a circuit board including:
      first and second groups of circuit board vias extending substantially from a first side of said circuit board towards a second side of said circuit board;
   a loop circuit having a loop inductance, said loop circuit defined from said first group of circuit board vias, through said first group of carrier vias to said first side of said circuit board and back through said second group of carrier vias, through said second group of circuit board vias;
   wherein said carrier vias of said first and second groups are arranged in an anti-parallel tessellation and include a substantial majority of all carrier vias for coupling respective power supply voltages; and
   wherein said circuit board vias of said first and second groups are arranged in an anti-parallel tessellation and include a substantial majority of all circuit board vias for coupling respective power supply voltages.

2. An apparatus as recited in claim 1 wherein:
   said carrier further includes:
      a first group of at least one lateral conductor;
      a second group of at least one lateral conductor;
      third and fourth groups of carrier vias extending from said first and second groups of at least one lateral conductor, respectively, substantially to a second side of said carrier;
   wherein said loop circuit is further defined from said first group of circuit board vias, through said third group of carrier vias, through said first group of at least one lateral conductor, through said first group of carrier vias, said loop circuit is further defined through said second group of carrier vias, through said second group of at least one lateral conductor, through said fourth group of carrier vias, through said second group of circuit board vias.

3. An apparatus as recited in claim 2 wherein said third group of carrier vias are subgrouped to define a first group of carrier via subgroups and said fourth group of carrier vias are subgrouped to define a second group of carrier via subgroups, said first group of carrier via subgroups electrically couple said first group of at least one lateral conductor to said first group of circuit board vias and second group of carrier via subgroups electrically couple said second group of at least one lateral conductor to said second group of circuit board vias, wherein said first and second groups of carrier via subgroups are arranged in an anti-parallel tessellation.

4. An apparatus of claim 2 wherein:
   said first group of at least one lateral conductor includes a first power plane;
   said first group and said third group of carrier vias are electrically connected to said first power plane;
   said second group of at least one lateral conductor includes a second power plane;
   said second group and said fourth group of carrier vias are electrically connected to said second power plane.

5. An apparatus of claim 2 wherein an average length of a carrier via of said first and second groups of carrier vias is greater than an average length of a carrier via of said third and fourth groups of carrier vias.

6. An apparatus as recited in claim 1 further comprising:
   first and second groups of electrically conducting structures on said first side of said circuit board;
   third and fourth groups of electrically conductive structures on said second side of said circuit board;
   said loop circuit further defined from said third group of electrically conductive structures, through said first group of circuit board vias, through said first group of electrically conductive structures, through said first group of carrier vias, said loop circuit further defined through said second group of carrier vias, through said second group of electrically conductive structures, through said second group of circuit board vias, to said fourth group of electrically conductive structures;
   wherein said electrically conductive structures of said first and second groups are arranged in an anti-parallel tessellation.
   wherein said electrically conductive structures of said third and fourth groups are arranged in an anti-parallel tessellation.

7. An apparatus as recited in claim 1 wherein a portion of said loop inductance associated with said first and second groups of carrier vias is less than 0.001 of an average inductance for an individual carrier via of said first and second groups.

8. An apparatus as recited in claim 1 wherein:
   said anti-parallel tessellation of said first and second groups of carrier vias defines a checkerboard pattern of carrier vias of said first and said second groups.

9. An apparatus as recited in claim 1 wherein:
   said anti-parallel tessellation of said first and second groups of carrier vias defines alternating rows of carrier vias of said first and said second groups.

10. An apparatus as recited in claim 1 wherein:
    said anti-parallel tessellation of said first and second groups of carrier vias defines anti-parallel pairs of carrier vias, each pair including a carrier via from said first group and from said second group;
    each anti-parallel pair has a mutual coupling of at least 0.80 of an average inductance of said carrier via from said first group and from said second group of said each pair.

11. An apparatus as recited in claim 1 wherein:
    said anti-parallel tessellation of said first and second groups of circuit board vias defines a checkerboard pattern of circuit board vias of said first and second groups.

12. An apparatus as recited in claim 1 wherein:
    said anti-parallel tessellation of said first and second groups of circuit board vias defines alternating rows of circuit board vias of said first and second groups.

13. An apparatus as recited in claim 1 wherein said portion of said loop inductance associated with said first and second groups of circuit board vias is less than 0.04 of an average inductance for an individual circuit board via of said first and second groups.

14. An apparatus as recited in claim 1 further comprising:
    a decoupling capacitor located on said second side of said circuit board, said decoupling capacitor having a first electrode electrically coupled to a circuit board via of said first group of circuit board vias, said decoupling capacitor having a second electrode electrically coupled to a circuit board via of said second group of circuit board vias.

15. An apparatus as recited in claim 14 wherein said decoupling capacitor has a third electrode electrically coupled to a circuit board via of said first group of circuit board vias, said decoupling capacitor has a fourth electrode electrically coupled to a circuit board via of said second group of circuit board vias.

16. An apparatus as recited in claim 1 further comprising:

an integrated circuit chip located said first side of said carrier, said integrated circuit chip including a first group of conductive structures electrically coupled to said first group of carrier vias, said integrated circuit chip including a second group of electrically conductive structures electrical coupled to said second group of carrier vias.

17. An apparatus comprising:

an integrated circuit carrier including first and second groups of carrier vias extending substantially from a first side of said carrier towards a second side of said carrier;

a circuit board including first and second groups of circuit board vias extending substantially from a first side of said circuit board towards a second side of said circuit board; and a loop circuit having a loop inductance, said loop circuit defined from said first group of circuit board vias, through said first group of carrier vias to said first side of said circuit board and back through said second group of carrier vias, through said second group of circuit board vias;

wherein said carrier vias of said first and second groups and said circuit board vias of said first and second groups are both arranged in respective anti-parallel tessellations, each such anti-parallel tessellation including an arrangement of multiple, parallely oriented conductive structures of the loop circuit wherein current flow through a first group of the conductive structures is in an opposing direction to the current flow through a second group of the conductive structures and wherein the arrangement provides for a reduction in the inductance of the loop circuit due to the mutual coupling among the conductive structures of the two groups and due to the multiple parallel conductive structures of each group.

18. The apparatus of claim 17, wherein said carrier vias of said first and second groups together from a substantial majority of all carrier vias for coupling to respective first and second power supply voltages.

19. The apparatus of claim 17, wherein said circuit board vias of said first and second groups together from a substantial majority of all circuit board vias for coupling to respective first and second power supply voltages.

* * * * *

UNITED STATES PATENT AND TRADEMARK OFFICE
CERTIFICATE OF CORRECTION

PATENT NO.        : 6,828,666 B1
APPLICATION NO.   : 09/099758
DATED             : December 7, 2004
INVENTOR(S)       : Dennis J. Herrell and Thomas P. Dolbear It is certified that error appears in the above-identified patent and that said Letters Patent is hereby corrected as shown below:

In the Specification

In column 15, line 17, please replace "circuit board" with --carrier--;

In column 18, line 1, please replace "circuit board" with --carrier--.

Signed and Sealed this
Fourteenth Day of April, 2015

Michelle K. Lee
*Director of the United States Patent and Trademark Office*